United States Patent
Liu et al.

(10) Patent No.: US 9,318,407 B2
(45) Date of Patent: Apr. 19, 2016

(54) POP PACKAGE STRUCTURE

(71) Applicant: Huawei Technologies Co., Ltd., Shenzhen (CN)

(72) Inventors: Weifeng Liu, Shenzhen (CN); Yuming Ye, Shenzhen (CN); Zhao Xiang, Shenzhen (CN); Zhi Xu, Kuala Lumpur (MY)

(73) Assignee: Huawei Technologies Co., Ltd., Shenzhen (CN)

( * ) Notice: Subject to any disclaimer, the term of this patent is extended or adjusted under 35 U.S.C. 154(b) by 56 days.

(21) Appl. No.: 14/107,808

(22) Filed: Dec. 16, 2013

(65) Prior Publication Data

US 2014/0097533 A1  Apr. 10, 2014

Related U.S. Application Data

(63) Continuation of application No. PCT/CN2012/083603, filed on Oct. 26, 2012.

(30) Foreign Application Priority Data

Dec. 21, 2011  (CN) .......................... 2011 1 0432932

(51) Int. Cl.
*H01L 23/10* (2006.01)
*H01L 23/34* (2006.01)
(Continued)

(52) U.S. Cl.
CPC ................ *H01L 23/34* (2013.01); *H01L 23/36* (2013.01); *H01L 23/3672* (2013.01);
(Continued)

(58) Field of Classification Search
CPC ........... H01L 2224/16145; H01L 2224/48145; H01L 2225/4824; H01L 25/0657; H01L 25/0655; H01L 2225/1023; H01L 2225/06589
USPC ......................................... 257/706, 707, 713
See application file for complete search history.

(56) References Cited

U.S. PATENT DOCUMENTS 5,016,138 A * 5/1991 Woodman ...................... 361/688
5,043,794 A * 8/1991 Tai et al. ........................ 257/686
(Continued)

FOREIGN PATENT DOCUMENTS

CN   1825230 A   8/2006
CN   1835230 A   9/2006
(Continued)

OTHER PUBLICATIONS

Foreign Communication From a Counterpart Application, Chinese Application No. 201110432932.X, Chinese Office Action dated Apr. 16, 2014, 7 pages.

(Continued)

*Primary Examiner* — S. V. Clark
(74) *Attorney, Agent, or Firm* — Conley Rose, P.C.; Grant Rodolph; Nicholas K. Beaulieu

(57) ABSTRACT

A package on package (PoP) package structure is disclosed, the structure includes at least two layers of carrier boards that are packaged and stacked in sequence, wherein chips are arranged on the bottom side of the carrier boards, a heat sink is arranged on the bottom side of a carrier board other than a layer-1 carrier board, a pad welded to a system board is arranged on the bottom side of the layer-1 carrier board, and a chip on a carrier board other than a top-layer carrier board is surface-mounted onto the heat sink adjacent to the chip. The heat sink increases the heat dissipation area of the chip, enhances the heat dissipation capabilities of the PoP stacked packages massively, breaks the bottleneck of the high-density integration and miniaturization of the PoP stacked packages, and enhances the packaging density of the PoP stacked packages.

18 Claims, 10 Drawing Sheets

(51) Int. Cl.
  *H01L 23/36* (2006.01)
  *H01L 23/367* (2006.01)
  *H01L 25/10* (2006.01)
  *H01L 25/065* (2006.01)

(52) U.S. Cl.
  CPC ......... *H01L 25/0657* (2013.01); *H01L 25/105* (2013.01); *H01L 2224/16225* (2013.01); *H01L 2224/73253* (2013.01); *H01L 2225/0652* (2013.01); *H01L 2225/06517* (2013.01); *H01L 2225/06572* (2013.01); *H01L 2225/06589* (2013.01); *H01L 2225/1023* (2013.01); *H01L 2225/1058* (2013.01); *H01L 2225/1094* (2013.01); *H01L 2924/10253* (2013.01); *H01L 2924/15311* (2013.01); *H01L 2924/15321* (2013.01); *H01L 2924/15331* (2013.01)

(56) References Cited

U.S. PATENT DOCUMENTS

| | | | |
|---|---|---|---|
| 5,548,161 | A * | 8/1996 | Hirano et al. ............. 257/722 |
| 5,883,426 | A | 3/1999 | Tokuno et al. |
| 5,990,550 | A * | 11/1999 | Umezawa ................ 257/712 |
| 6,297,960 | B1 | 10/2001 | Moden et al. |
| 6,301,779 | B1 | 10/2001 | Azar |
| 7,679,176 | B2 * | 3/2010 | Asano et al. ............. 257/686 |
| 2002/0024798 | A1 | 2/2002 | Moden et al. |
| 2004/0080036 | A1 | 4/2004 | Chang et al. |
| 2004/0183183 | A1 | 9/2004 | Cady et al. |
| 2005/0199993 | A1 | 9/2005 | Lee et al. |
| 2006/0195671 | A1 | 8/2006 | Nogami |
| 2006/0220207 | A1 | 10/2006 | Akahoshi |
| 2006/0231938 | A1 | 10/2006 | Mangrum |
| 2006/0286822 | A1 | 12/2006 | Thomas et al. |
| 2008/0048309 | A1 | 2/2008 | Corisis et al. |
| 2009/0294947 | A1 | 12/2009 | Tain et al. |
| 2011/0176280 | A1 | 7/2011 | Lee |

FOREIGN PATENT DOCUMENTS

| | | |
|---|---|---|
| CN | 1961421 A | 5/2007 |
| CN | 101097906 A | 1/2008 |
| CN | 101431033 A | 5/2009 |
| CN | 101937907 A | 1/2011 |
| CN | 102522380 A | 6/2012 |
| EP | 0729184 A2 | 8/1996 |
| WO | 2004015767 A1 | 2/2004 |
| WO | 2012002294 A1 | 1/2012 |

OTHER PUBLICATIONS

Foreign Communication From a Counterpart Application, Chinese Application No. 201110432932.X, Chinese Office Action dated Aug. 28, 2013, 7 pages.

Foreign Communication From a Counterpart Application, PCT Application No. PCT/CN2012/083603, Chinese Search Report dated Jan. 17, 2013, 8 pages.

Foreign Communication From a Counterpart Application, PCT Application No. PCT/CN2012/083603, Chinese Written Opinion dated Jan. 17, 2013, 5 pages.

Foreign Communication From a Counterpart Application, European Application No. 12859210.2, Extended European Search Report dated Dec. 16, 2013, 8 pages.

* cited by examiner

POP PACKAGE STRUCTURE

CROSS-REFERENCE TO RELATED APPLICATIONS

This application is a continuation of International Application No. PCT/CN2012/083603, filed on Oct. 26, 2012, which claims priority to Chinese Patent Application No. 201110432932.X, filed on Dec. 21, 2011, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to the field of printed circuit board (PCB) package heat dissipation technologies, and in particular, to a package on package (PoP) package structure.

BACKGROUND

As a main manner of high-density integration of packages currently, PoP attracts more and more attention. However, the increase of stacked packages leads to a problem of heat dissipation, which becomes one of the bottlenecks that hinder PoP applications.

Chip stacking is one of the main means of improving high-density integration of electronic packages, and a PoP design has been developed and applied in the industry widely. A typical two-layer PoP design is shown in FIG. 1. A layer-2 package 13 is welded onto a layer-1 package 11 through a reflow process of solder balls. For a PoP design with more layers, the foregoing process may be repeated. To prevent interference between the layer-1 chip and the layer-2 carrier board, the diameter of a solder ball 12 around the layer-2 carrier board is generally designed as greater than the height of the chip. In this way, a certain gap exists between the layer-1 chip and the layer-2 carrier board. Through the gap, a cooling fan can dissipate heat for the chip.

The PoP design can improve package density, but is not helpful for heat dissipation of the chip. On the contrary, multiple chips are stacked together, heat accumulates inside the PoP packages, and the heat dissipation performed by the cooling fan through the gap between the chip and the carrier board can hardly meet requirements. The heat dissipation of the PoP becomes a main bottleneck of high-density PoP integration.

Therefore, persons skilled in the art are urgently seeking a technical solution to improving heat dissipation capabilities of PoP packages while ensuring high density and miniaturization of PoP packages.

SUMMARY

The present invention provides a PoP package structure to improve heat dissipation capabilities of PoP packages while ensuring high-density integration and miniaturization of the PoP packages.

To fulfill the foregoing objective, the present invention provides the following technical solution:

A PoP package structure includes at least two layers of carrier boards that are packaged and stacked in sequence, where chips are arranged on the bottom side of the carrier boards, a heat sink is arranged on the bottom side of a carrier board other than a layer-1 carrier board, a pad welded to a system board is arranged on the bottom side of the layer-1 carrier board, and a chip on a carrier board other than a top-layer carrier board is surface-mounted onto the heat sink adjacent to the chip.

As seen from the above technical solution, in the PoP package structure provided in the embodiments of the present invention, a heat sink is arranged on the bottom side of a carrier board other than the layer-1 carrier board to dissipate heat for the chip (bare silicon or packaged chip) on the carrier board of the upper layer. In the embodiments of the present invention, the heat sink increases the heat dissipation area of the chip, enhances the heat dissipation capabilities of the PoP stacked packages massively, breaks the bottleneck of the high-density integration and miniaturization of the PoP stacked packages, and enhances the packaging density of the PoP stacked packages.

BRIEF DESCRIPTION OF THE DRAWINGS

To illustrate the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

DETAILED DESCRIPTION

Embodiments of the present invention disclose a PoP package structure to improve heat dissipation capabilities of PoP packages while ensuring high-density integration and miniaturization of the PoP packages.

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

Figure 1:
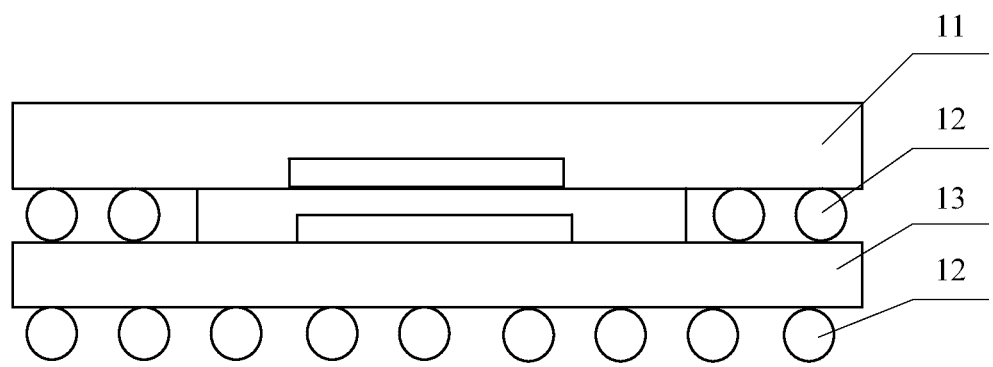
FIG. 1 is a schematic structural diagram of a two-layer PoP package structure in the prior art.
Figure 2:
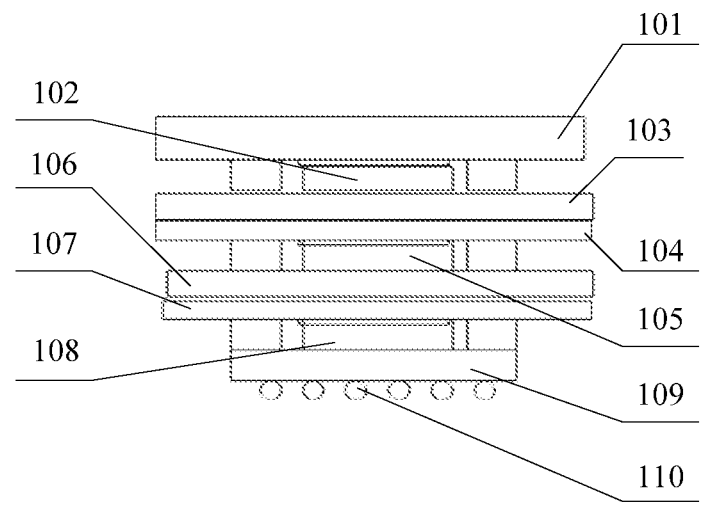
FIG. 2 is a schematic structural diagram of a PoP package structure according to an embodiment of the present invention.

Reference is made to FIG. 2. FIG. 2 is a schematic structural diagram of a PoP package structure according to an embodiment of the present invention.

A PoP package structure provided in an embodiment of the present invention includes at least two layers of carrier boards that are packaged and stacked in sequence, where chips are arranged on the bottom side of the carrier board. The essence of the embodiment of the present invention is: A heat sink is arranged on the bottom side of a carrier board other than a layer-1 carrier board, a pad welded to a system board is arranged on the bottom side of the layer-1 carrier board, and a chip on a carrier board other than a top-layer carrier board is surface-mounted onto the heat sink adjacent to the chip.

FIG. 2 discloses a PoP package structure with three layers of carrier boards. As shown in FIG. 2, because a layer-1 carrier board 109 needs to be welded onto a system board (a pad 110 is arranged on the bottom side of the layer-1 carrier board 109), no heat sink can be arranged on the top side of the layer-1 carrier board 109, and there is no need to arrange a heat sink thereon. A chip 105 is arranged on the top side of a layer-2 carrier board 106, and a heat sink 107 is arranged on the bottom side of the layer-2 carrier board 106, where the heat sink 107 is used to dissipate heat for a chip 108 on the layer-1 carrier board 109. A chip 102 is arranged on the top side of a top-layer carrier board 103, and a heat sink 104 is arranged on the bottom side of the top-layer carrier board 103, where the heat sink 104 is used to dissipate heat for a chip 105 on the layer-2 carrier board 106. To improve heat dissipation of the chip 102 on the top-layer carrier board 103, a heat sink 101 may be bonded onto the chip 102 on the top-layer carrier board 103 through a thermally conductive adhesive.

Persons skilled in the art understand that the PoP package structure disclosed in the embodiment of the present invention is not limited to the form of the structure that has three layers of carrier boards. As long as there are more than two layers of carrier boards, the heat dissipation method for the PoP package structure disclosed in the embodiment of the present invention is applicable. That is, heat sinks are arranged on the bottom sides of all carrier boards other than the layer-1 carrier board 109, and it is ensured that the chips on all carrier boards other than the top-layer carrier board 103 are surface-mounted onto the heat sinks adjacent to the chips (that is, the chip 108 on the layer-1 carrier board 109 is surface-mounted onto the heat sink 107 of the layer-2 carrier board 106, and the chip 105 on the layer-2 carrier board 106 is surface-mounted onto the heat sink 104 of the top-layer carrier board 103).

For the PoP design, electrical connections (for grounding and either of signals and power supply) are required between layers. The connections may be implemented by leaded or leadless solder balls or in other manners such as using a conductive adhesive. The heat sinks should not contact the electrical connection regions. In order that the heat sinks do not contact the electrical connection regions, FIG. 3 to FIG. 8 give several possible copper foil exterior designs, which, however, shall not be construed as a limitation.

Figure 3:
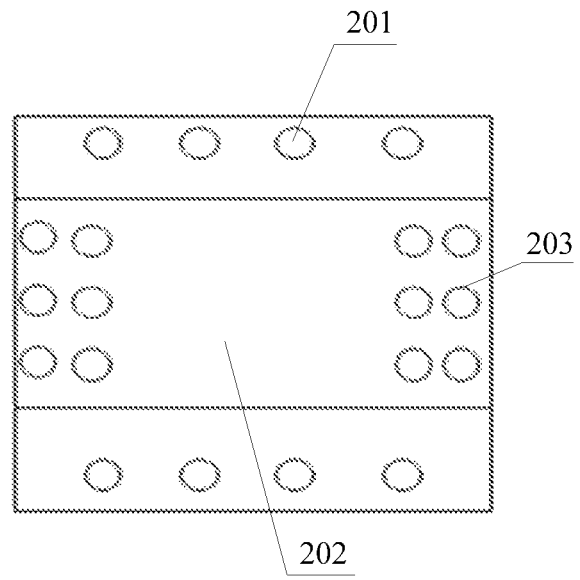
FIG. 3 is a schematic structural diagram of a first shape of a heat sink according to an embodiment of the present invention.
Figure 4:
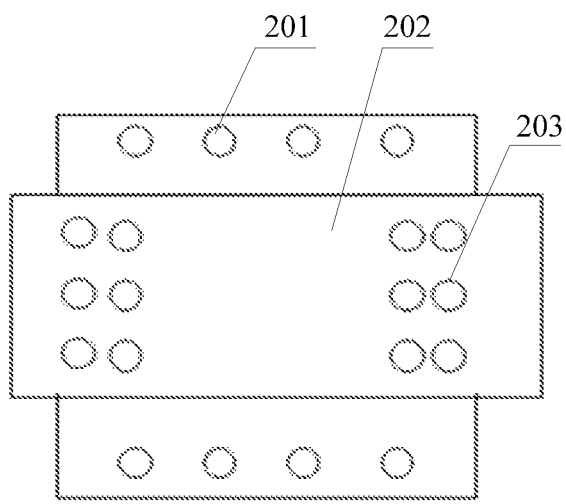
FIG. 4 is a schematic structural diagram of a second shape of a heat sink according to an embodiment of the present invention.
Figure 5:
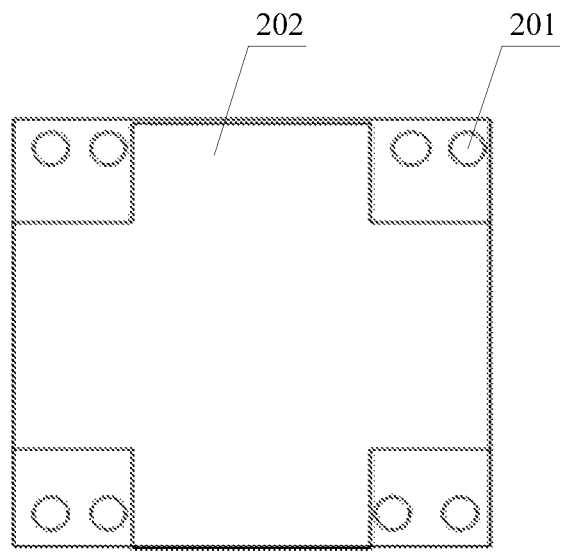
FIG. 5 is a schematic structural diagram of a third shape of a heat sink according to an embodiment of the present invention.
Figure 6:
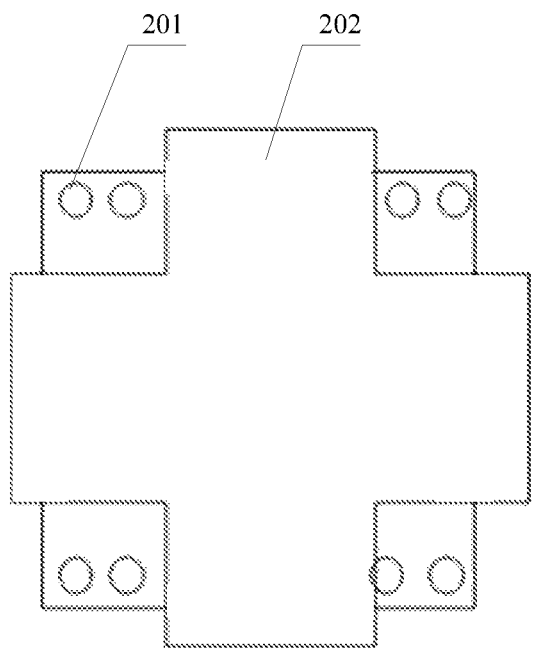
FIG. 6 is a schematic structural diagram of a fourth shape of a heat sink according to an embodiment of the present invention.
Figure 7:
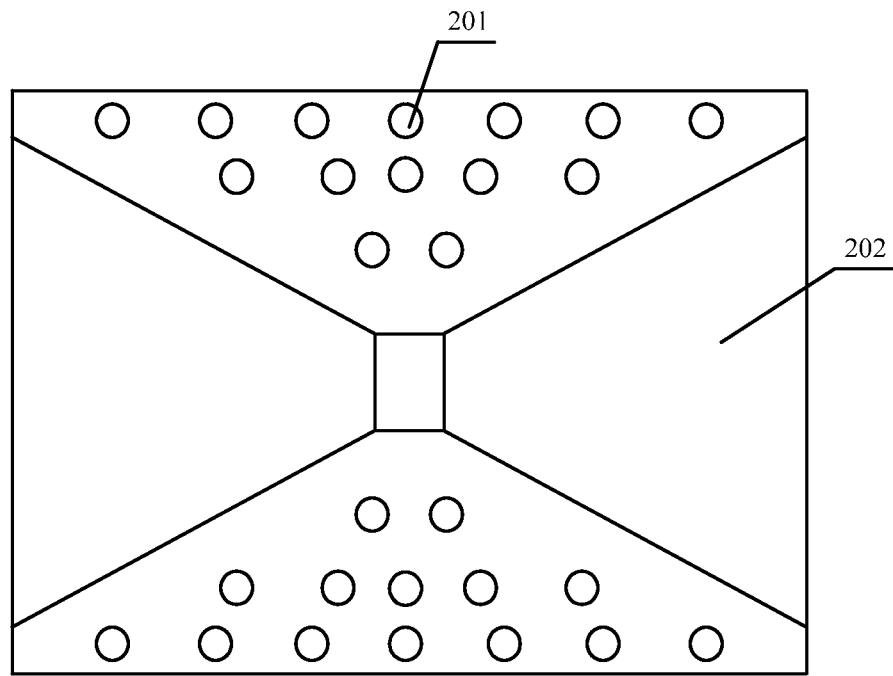
FIG. 7 is a schematic structural diagram of a fifth shape of a heat sink according to an embodiment of the present invention.
Figure 8:
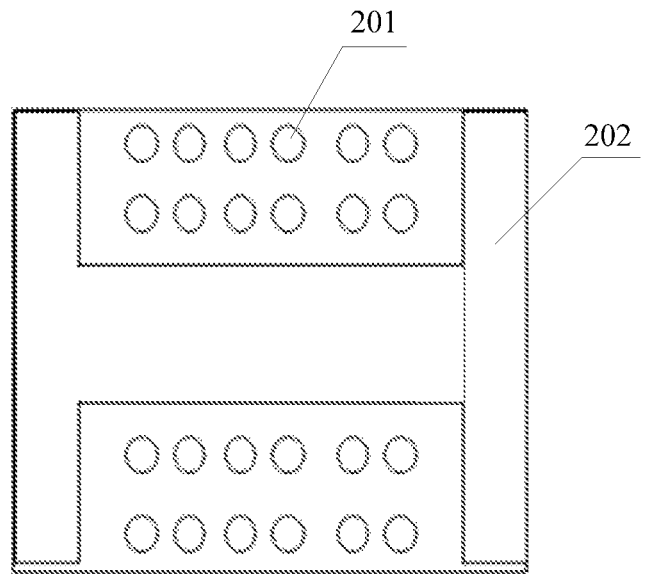
FIG. 8 is a schematic structural diagram of a sixth shape of a heat sink according to an embodiment of the present invention.

In the embodiment, a heat sink 202 may be in a rectangular shape shown in FIG. 3 and FIG. 4, and may have pads 203. Evidently, the heat sink 202 does not contact a signal connection point 201 located at the edge on both sides of a carrier board. A heat sink 202 may also be in a cross shape shown in FIG. 5 and FIG. 6, and evidently, the heat sink 202 does not contact a signal connection point 201 located in the four corners of a carrier board. A heat sink 202 may also be in an I-shape shown in FIG. 8, and evidently, the heat sink 202 does not contact a signal connection point 201 located in the middle on both sides of a carrier board. A heat sink 202 may also be an irregular structure shown in FIG. 7, and evidently, the heat sink 202 does not contact a signal connection point 201 located on both sides of a carrier board and distributed in a sector shape. The heat sink 202 may also be a structure of other forms, which are not described herein exhaustively.

Figure 9:
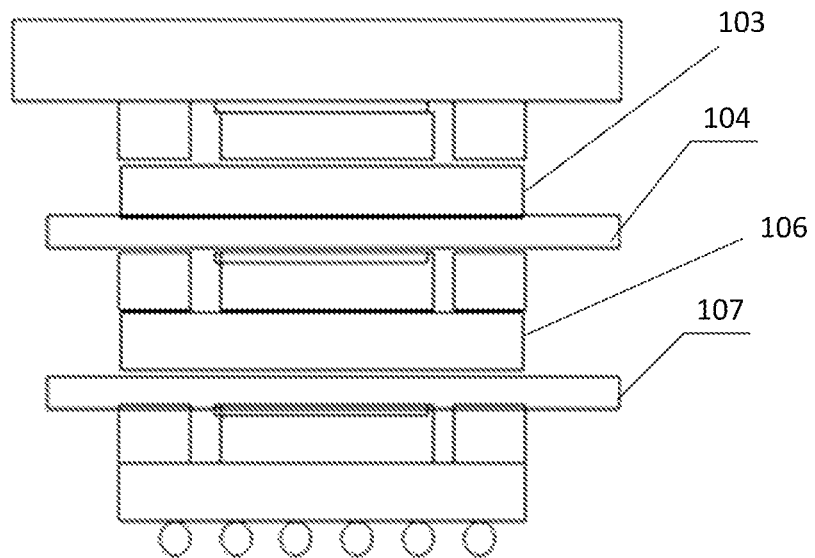
FIG. 9 is a schematic structural diagram of another PoP package structure according to an embodiment of the present invention.

To further improve the heat dissipation effect, the heat sink should extend around as far as possible, that is, extend out of a carrier board. As shown in FIG. 9, a heat sink 107 extends out of a layer-2 carrier board 106, and a heat sink 104 extends out of a top-layer carrier board 103, and therefore, a gap exists between the heat sink 107 and the heat sink 104. When airblast cooling is applied, air flows between the heat sinks to carry away heat of the heat sinks.

Figure 10:
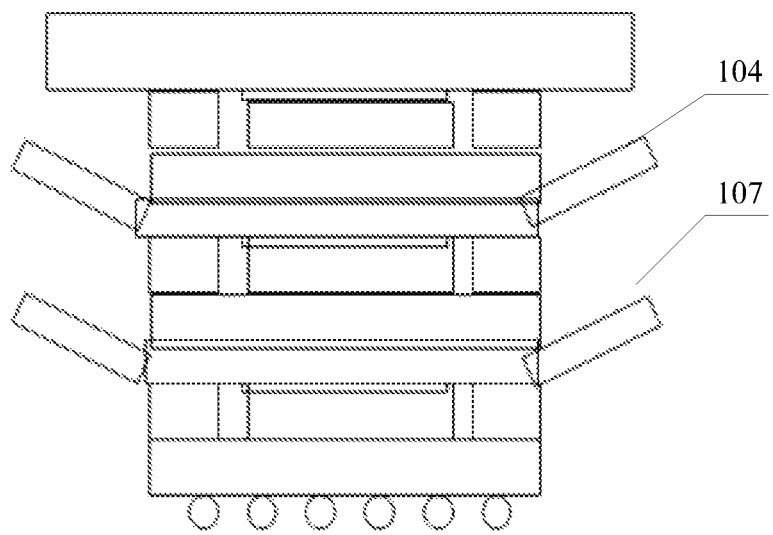
FIG. 10 is a schematic structural diagram of another PoP package structure according to an embodiment of the present invention.
Figure 11:
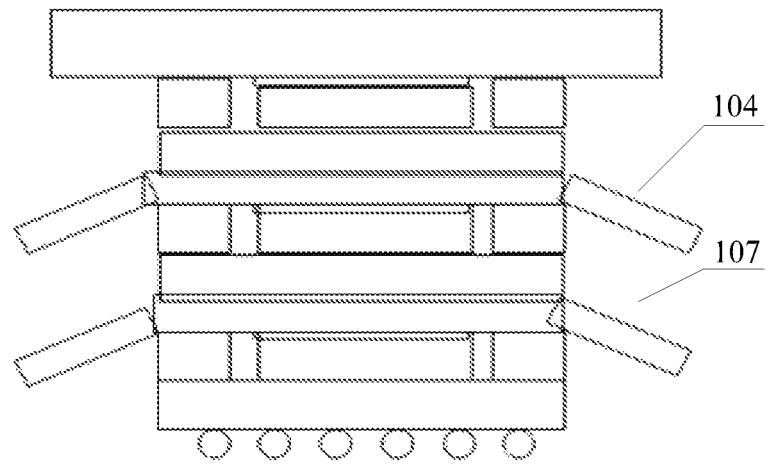
FIG. 11 is a schematic structural diagram of another PoP package structure according to an embodiment of the present invention.

The heat sink may extend out of a PoP package, as shown in FIG. 9; or the heat sink may be folded in various shapes, as shown in FIG. 10 and FIG. 11. As shown in FIG. 10, the extension parts of a heat sink 107 and a heat sink 104 on the carrier boards bend upward; and, as shown in FIG. 11, the extension parts of a heat sink 107 and a heat sink 104 on the carrier boards bend downward.

A thermal interface material (TIM) may be added between a heat sink and a chip to reduce thermal resistance between the heat sink and the chip so that heat is conducted from the chip to the heat sink effectively. The thickness of the heat sink may be adjusted according to the heat dissipation requirement.

The process of preparing a PoP package structure is described briefly below (although the following example describes a ball grid array (BGA) circuit board package or a chip scale package (CSP), the preparation process is also applicable to other forms of packages):

First, all layers of carrier boards of the PoP package structure are prepared. Using the PoP package structure with three layers of carrier boards as an example, a layer-1 carrier board, a layer-2 carrier board, and a top-layer carrier board are prepared in sequence. A layer-1 carrier board 109 is directly welded onto a system board, and no more carrier boards exist on a top-layer carrier board 103. Therefore, their design is different from the design of all other layers of carrier boards.

Figure 12:
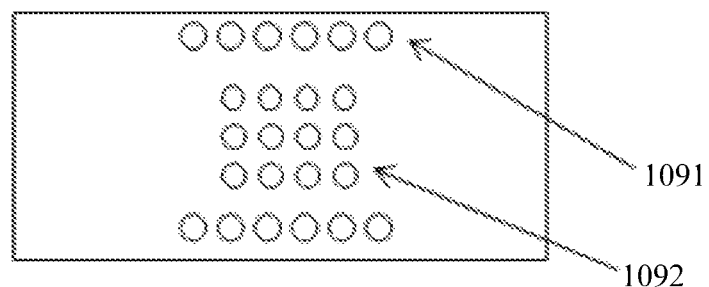
FIG. 12 is a schematic structural diagram of the bottom side of a layer-1 carrier board according to an embodiment of the present invention.
Figure 13:
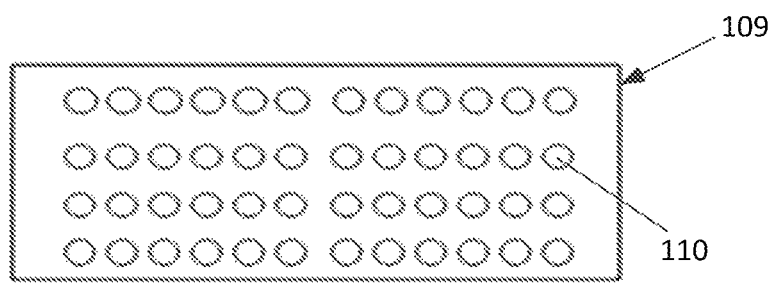
FIG. 13 is a schematic structural diagram of the bottom side of a layer-1 carrier board according to an embodiment of the present invention.

Reference is made to FIG. 12 and FIG. 13. FIG. 12 is a schematic structural diagram of the bottom side of a layer-1 carrier board according to an embodiment of the present invention, and FIG. 13 is a schematic structural diagram of the bottom side of a layer-1 carrier board according to an embodiment of the present invention.

A pad 110 connected to the solder balls is arranged on the bottom side of the layer-1 carrier board 109. The solder balls will be ultimately welded onto the system board. Two types of pads exist on the top side, and the pad in the middle is configured to weld the BGA/CSP package (chip pad 1092), and the pad at the edge is configured to weld the upper-layer carrier board (PoP pad 1091).

Figure 14:
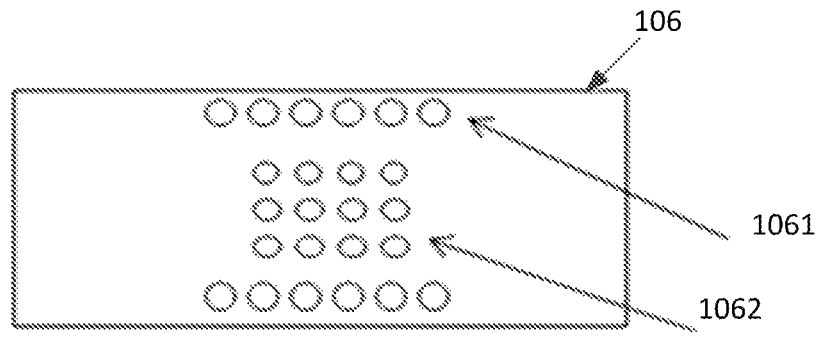
FIG. 14 is a schematic structural diagram of the bottom side of a layer-2 carrier board according to an embodiment of the present invention.
Figure 15:
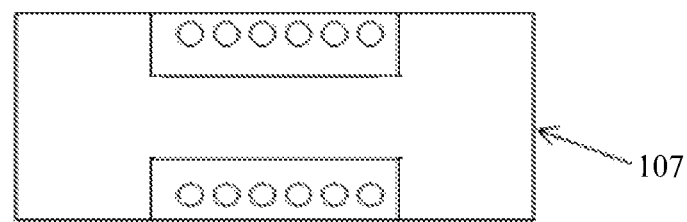
FIG. 15 is a schematic structural diagram of the bottom side of a layer-2 carrier board according to an embodiment of the present invention.

Reference is made to FIG. 14 and FIG. 15. FIG. 14 is a schematic structural diagram of the bottom side of a layer-2 carrier board according to an embodiment of the present invention, and FIG. 15 is a schematic structural diagram of the bottom side of a layer-2 carrier board according to an embodiment of the present invention.

For the carrier boards at layer 2 and above (except the top layer), two types of pads exist on the top side of a layer-2 carrier board 106, and the pad in the middle is used to weld a BGA/CSP package (a chip pad 1062), and the pad at the edge is used to weld an upper-layer carrier board (a PoP pad 1061). There may be one row or several rows of pads, depending on the electrical connection requirement. A heat sink 107 for dissipating heat exists on the bottom side, a pad (e.g., a PoP pad) for welding the upper-layer carrier board exists at the edge, and the heat sink 107 is isolated from the PoP pad.

Figure 16:
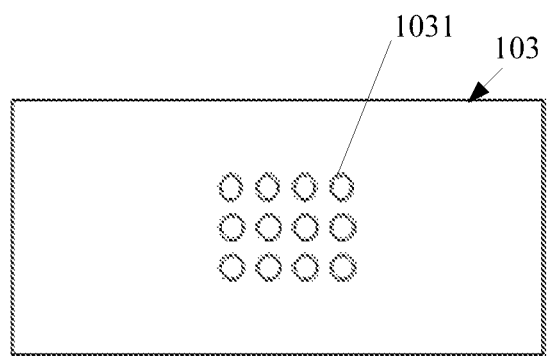
FIG. 16 is a schematic structural diagram of the bottom side of a top-layer carrier board according to an embodiment of the present invention.
Figure 17:
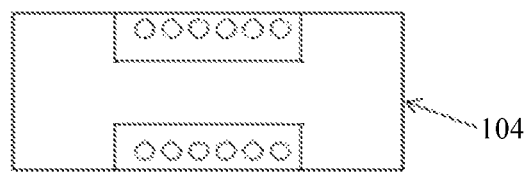
FIG. 17 is a schematic structural diagram of the bottom side of a top-layer carrier board according to an embodiment of the present invention.

Reference is made to FIG. 16 and FIG. 17. FIG. 16 is a schematic structural diagram of the bottom side of a top-layer carrier board according to an embodiment of the present invention, and FIG. 17 is a schematic structural diagram of the bottom side of a top-layer carrier board according to an embodiment of the present invention.

Like the bottom side of the layer-2 carrier board 106, the bottom side of a top-layer carrier board 103 has a heat sink 104 for dissipating heat, and, at the edge, has a pad (e.g., a PoP pad) for welding the upper-layer carrier board, and the heat sink 104 is isolated from the PoP pad. It is appropriate that only the pad (e.g., a chip pad 1031) for welding the chip exists on the top side of the top-layer carrier board 103.

This embodiment discloses stacking of the same packages, but is also applicable to stacking of different packages. If different packages are stacked inside the PoP package structure, the same preparation process is applicable, which is not described herein. For the preparation of a heat sink on the bottom side at layer 2 or above, the heat sink may be press-fit directly in the preparation of the PCB carrier board, and then the heat sink is etched into the corresponding heat sink shape. In this process, the heat sink may also be etched into a PoP pad (any two adjacent layers of the carrier boards are connected through the PoP pad, and the PoP pad is isolated from the heat sink). The pad on the bottom side may be connected to the pad on the top side by a through-hole. The preparation of such carrier boards is the same as an ordinary PCB preparation process, which is not described herein.

Figure 18:
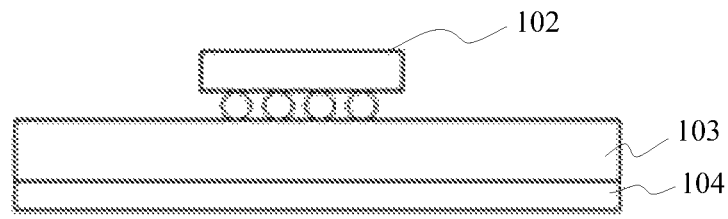
FIG. 18 is a schematic structural diagram of a top-layer carrier board according to an embodiment of the present invention.
Figure 19:
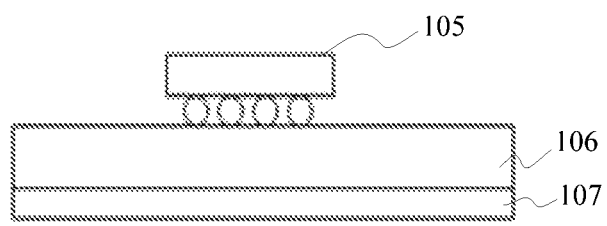
FIG. 19 is a schematic structural diagram of a layer-2 carrier board according to an embodiment of the present invention.
Figure 20:
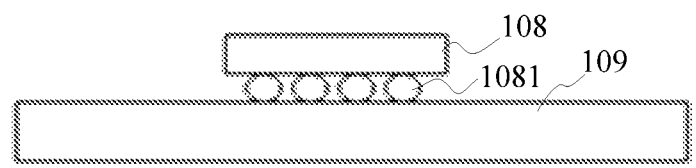
FIG. 20 is a schematic structural diagram of a layer-1 carrier board according to an embodiment of the present invention.

Reference is made to FIG. 18 to FIG. 20. FIG. 18 is a schematic structural diagram of a top-layer carrier board according to an embodiment of the present invention, FIG. 19 is a schematic structural diagram of a layer-2 carrier board according to an embodiment of the present invention, and FIG. 20 is a schematic structural diagram of a layer-1 carrier board according to an embodiment of the present invention.

A chip (e.g., a BGA/CSP package) is reflow-welded onto a carrier board. In this process, solder balls 1081 may be welded onto the carrier board to form corresponding PoP solder balls. First, a solder paste is printed on the top side of each layer through a stencil, and then a chip is placed in the chip pad region, where the solder balls of the chip are exactly opposite to the pad of the carrier board (the solder balls of a chip 102 are exactly opposite to the pad of a top-layer carrier board 103; the solder balls of a chip 105 are exactly opposite to the pad of a layer-2 carrier board 106; and the solder balls of a chip 108 are exactly opposite to the pad of a layer-1 carrier board 109). In addition, solder balls (such as solder balls 111 in FIG. 21) are placed on the edge PoP pad, where the diameter of each solder ball may be determined according to the height of the welded chip and thickness of a thermal interface material 112 to be used. Then the carrier boards at all layers undergo high-temperature reflow so that the chips are welded onto the PoP carrier boards while the PoP solder balls are formed.

Figure 21:
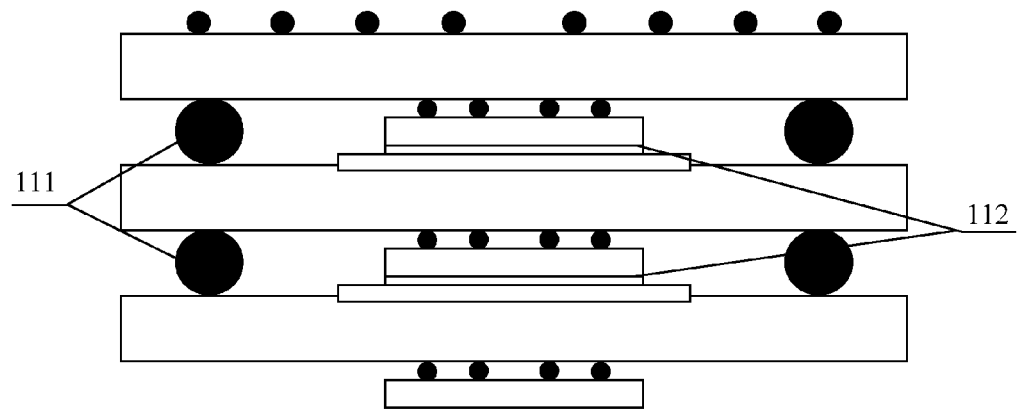
FIG. 21 is a schematic structural diagram of all layers of carrier boards after stacking reflow according to an embodiment of the present invention.

Reference is made to FIG. 21. FIG. 21 is a schematic structural diagram of all layers of carrier boards after stacking reflow according to an embodiment of the present invention.

In the process of stacking reflow of the carrier boards, all layers of carrier boards need to be reversed, and then solder paste is printed on the bottom-layer pad and on the PoP pads of all other layers. In the printing process, the corresponding tooling needs to be designed to support the carrier boards and prevent slanting from crushing the chips. Meanwhile, on the bottom side on the carrier boards at layer 2 or above (taking three layers of carrier boards as an example, the layer-2 carrier board and the top-layer carrier board), a thermal interface material 112 is placed exactly opposite to the chip region. The area of the thermal interface material 112 should be consistent with the chip area, and its thickness is determined according to the heat dissipation requirement and the PoP design. Then all layers of carrier boards are stacked together according to the stack design. A layer-1 carrier board is placed on the top, and a top-layer carrier board is placed at the bottom. Tooling needs to be designed for ensuring stability of the stack structure. Solder balls are placed on the pad of the layer-1 carrier board, and then the entire PoP package structure is placed into a reflow furnace for reflowing. In this way, all layers of carrier boards are welded together, and a ball grid array of the bottom carrier board is formed. After the entire process is complete, the PoP package structure is shown in FIG. 21.

Figure 22:
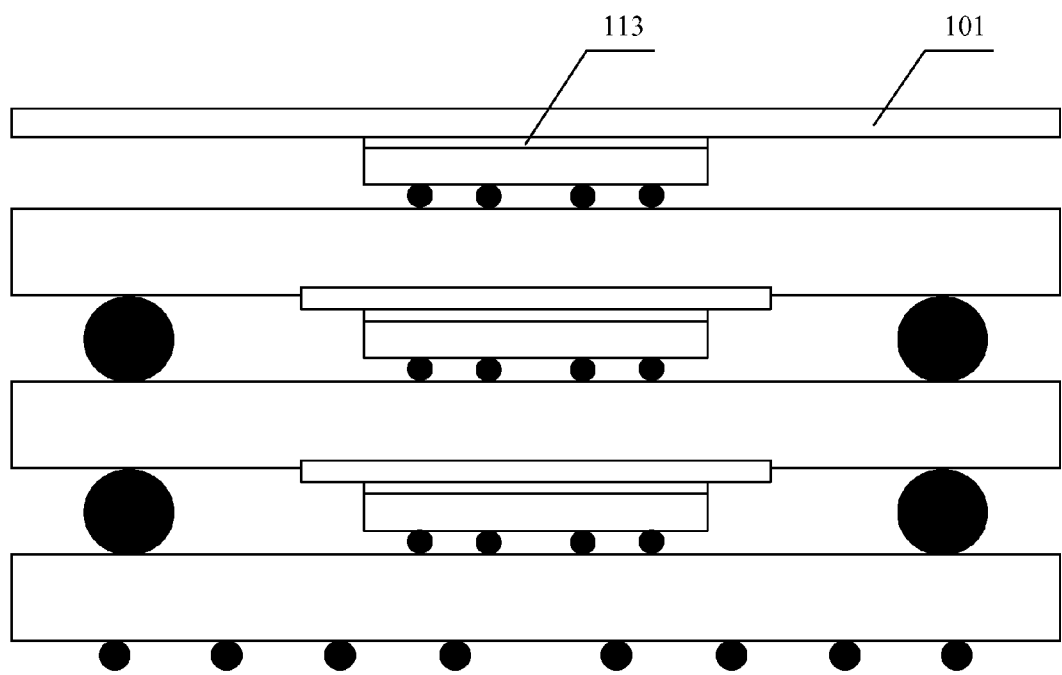
FIG. 22 is a schematic structural diagram of a PoP package structure in which a top-layer chip is surface-mounted onto a heat sink according to an embodiment of the present invention.

Reference is made to FIG. 22. FIG. 22 is a schematic structural diagram of a PoP package structure in which a top-layer chip is surface-mounted onto a heat sink according to an embodiment of the present invention.

To improve heat dissipation of the chip on the top-layer carrier board, a heat sink 101 is bonded onto the chip on the top-layer carrier board through a thermally conductive adhesive 113, and a pad for welding the chip is arranged on the top side of the top-layer carrier board. The heat sink 101 may be bonded onto the chip through a thermally conductive adhesive 113 in this embodiment, and the heat sink can extend out of the PoP package structure to dissipate heat efficiently.

Figure 23:
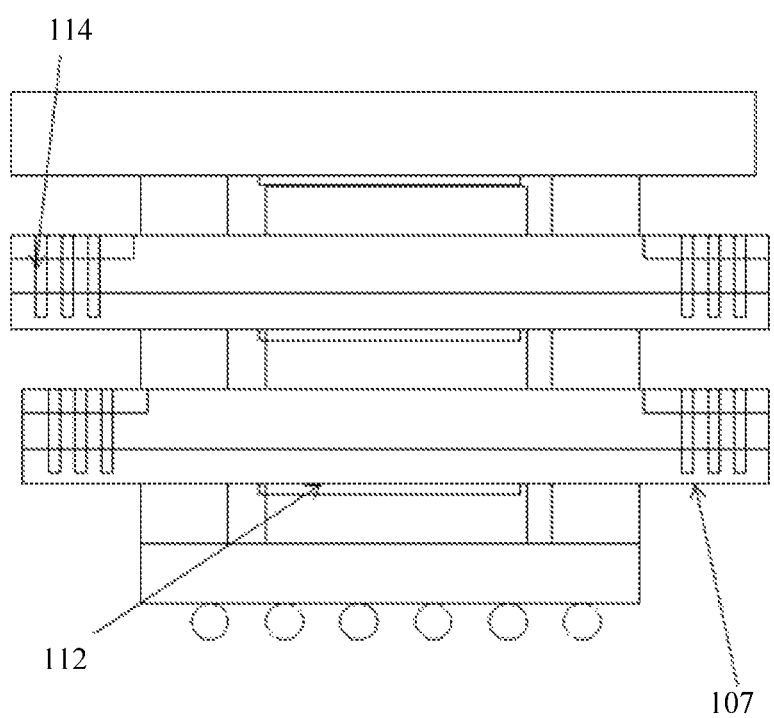
FIG. 23 is a schematic structural diagram of a PoP package structure with copper plating or heat dissipating holes on a sidewall according to an embodiment of the present invention.

Reference is made to FIG. 23. FIG. 23 is a schematic structural diagram of a PoP package structure with copper plating or heat dissipating holes on a sidewall according to an embodiment of the present invention.

To further improve the heat dissipation effect of the PoP package structure, a heat dissipating copper plate or copper sheet may be bonded as a heat dissipating structure onto the heat sink. Heat dissipating holes 114 may also be opened on the heat sink, or copper may be plated on the sidewall of the carrier board (that is, a heat dissipating copper sheet is arranged on the sidewall of the carrier board) to further enhance heat dissipation capabilities.

The heat sink disclosed in all the above embodiments is preferably a heat dissipating structure of a copper material such as a copper sheet or a copper foil. The copper sheet has an excellent heat dissipation effect and can be etched into various shapes.

In conclusion, a copper foil (a heat sink) is designed in the carrier board region that contacts the top of the chip, and the copper foil is used to assist in heat dissipation. Through the layout design, electrical signals may be isolated from the heat dissipation channel. A TIM needs to be added between the copper foil and the chip to reduce thermal resistance between the copper foil and the chip so that heat is conducted from the chip to the copper foil effectively. The thickness of the copper foil may be adjusted according to the heat dissipation requirement.

In the PoP package structure provided in the embodiment of the present invention, a heat sink is arranged on the bottom side of a carrier board other than the layer-1 carrier board to dissipate heat for the chip (e.g., bare silicon or a packaged chip) on the carrier board of the upper layer. In the embodiment of the present invention, the heat sink increases the heat dissipation area of the chip, enhances the heat dissipation capabilities of the PoP stacked packages massively, breaks the bottleneck of the high-density integration and miniaturization of the PoP stacked packages, and enhances the packaging density of the PoP stacked packages.

The embodiments in the specification are described in a progressive manner, mutual reference may be made to the same or similar part of the embodiments, and each embodiment focuses on differences from other embodiments.

The foregoing descriptions of the disclosed embodiments enable those skilled in the art to implement or use the embodiments of the invention. Various modifications of the embodiments are apparent to those skilled in the art, and general principles defined herein can be implemented in other embodiments without departing from the spirit or scope of the invention. Therefore, the invention is not limited to the exemplary embodiments given herein, but is accorded the broadest scope that matches the principles and novelty disclosed herein.

What is claimed is:

1. A package on package (PoP) package structure, comprising:
    a layer-1 carrier board comprising a pad arranged on a bottom side of the layer-1 carrier board that is configured to weld the PoP package structure to a system board;
    a top-layer carrier board;
    at least one other carrier board positioned between the layer-1 carrier board and the top-layer carrier board, wherein the layer-1 carrier board, the top-layer carrier board, and the at least one other carrier board are packaged and stacked in sequence;
    a heat sink that is arranged on a bottom side of the top-layer carrier board and/or a bottom side of the at least one other carrier board, wherein the heat sink includes an extension part that extends out of the top-layer carrier board or the at least one other carrier board and that bends upward or downward; and
    a chip on the layer-1 carrier board and/or on the at least one other carrier board that is surface-mounted onto the heat sink adjacent to the chip.

2. The PoP package structure according to claim 1, wherein the heat sink does not contact an electrical connection region on the top-layer carrier board or the at least one other carrier board that is connected to the heat sink.

3. The PoP package structure according to claim 2, wherein the heat sink comprises a rectangular shape, an I-shape, a crossshape, or an irregular shape.

4. The PoP package structure according to claim 1, wherein a thermal interface material is arranged between the heat sink and the chip.

5. The PoP package structure according to claim 1, wherein a second heat sink is bonded onto a chip on the top-layer carrier board through a thermally conductive adhesive.

6. The PoP package structure according to claim 1, wherein a heat dissipating copper plate is arranged on the heat sink.

7. The PoP package structure according to claim 1, wherein heat dissipating holes are opened on the heat sink.

8. The PoP package structure according to claim 1, wherein a heat dissipating copper sheet is arranged on a sidewall of the top-layer carrier board or the at least one other carrier board where the heat sink is arranged.

9. The PoP package structure according to claim 1, wherein the heat sink comprises a copper sheet that is directly press-fit into the top-layer carrier board or the at least one other carrier board where the heat sink is arranged and is etched into a corresponding pattern.

10. The PoP package structure according to claim 1, wherein any two adjacent layers of the layer-1 carrier board, the top-layer carrier board, and the at least one other carrier board are connected through a PoP pad.

11. The PoP package structure according to claim 10, wherein the PoP pad is isolated from the heat sink.

12. A package on package (PoP) package structure, comprising:
    a first carrier board;
    a second carrier board that is packaged and stacked in sequence with the first carrier board;
    a heat sink that is arranged on a bottom side of the second carrier board; and
    a chip that is arranged on the first carrier board and that is surface-mounted to the heat sink,
    wherein the heat sink comprises an I-shape or a cross-shape, and
    wherein the heat sink comprises an extension part that extends out of the second carrier board and that bends upward or downward.

13. The PoP package structure according to claim 12, wherein the heat sink comprises outward portions that extend out from the first carrier board and the second carrier board, and wherein the outward portions are at an angle with respect to the first carrier board and the second carrier board.

14. The PoP package structure according to claim 12, wherein a second heat sink is bonded onto a chip on the top-layer carrier board through a thermally conductive adhesive.

15. The PoP package structure according to claim 12, wherein a thermal interface material is arranged between the heat sink and the chip.

16. The PoP package structure according to claim 12, wherein a heat dissipating copper plate is arranged on the heat sink.

17. The PoP package structure according to claim 12, wherein heat dissipating holes are opened on the heat sink.

18. The PoP package structure according to claim 12, wherein the first carrier board and the second carrier board are connected through a PoP pad.

* * * * *